United States Patent
Ohshima et al.

(10) Patent No.: US 7,372,302 B1
(45) Date of Patent: May 13, 2008

(54) HIGH SPEED, OUT-OF-BAND DIFFERENTIAL PIN DRIVER

(75) Inventors: Atsushi Ohshima, Tokyo (JP); Toshihiro Nomura, Yokohama (JP); Howard Maassen, San Jose, CA (US)

(73) Assignee: Credence Systems Corporation, Milpitas, CA (US)

( * ) Notice: Subject to any disclaimer, the term of this patent is extended or adjusted under 35 U.S.C. 154(b) by 99 days.

(21) Appl. No.: 11/477,971

(22) Filed: Jun. 28, 2006

Related U.S. Application Data (60) Provisional application No. 60/764,392, filed on Feb. 1, 2006.

(51) Int. Cl.
    *H03K 19/0175* (2006.01)
(52) U.S. Cl. .......................... 326/82; 326/16
(58) Field of Classification Search ............ 326/82–83, 326/86–87, 16; 327/108, 109
See application file for complete search history.

(56) References Cited

U.S. PATENT DOCUMENTS

| | | | |
|---|---|---|---|
| 6,968,172 B2* | 11/2005 | Saito | 455/306 |
| 7,112,989 B2* | 9/2006 | Ooshita et al. | 326/27 |
| 7,276,970 B2* | 10/2007 | Khorramabadi | 330/253 |

* cited by examiner

*Primary Examiner*—James H. Cho (57) ABSTRACT

A driver block for a differential pin driver that supports out-of-band signaling. The driver block includes a main enable switch that is controlled by a high speed driver inhibit (DINH) signal. The main enable switch controls coupling between a main current source and a differential pin driver output stage. The main enable switch is coupled in series with an output select switch that selects between a positive output and a negative output. The driver block also includes a positive enable switch for controlling coupling between the positive output and a positive level shifter that shifts voltages of the positive output. The driver block also includes a negative enable switch for controlling coupling between the negative output and a negative level shifter that shifts voltages of the negative output.

20 Claims, 8 Drawing Sheets

HIGH SPEED, OUT-OF-BAND DIFFERENTIAL PIN DRIVER

CROSS REFERENCE TO RELATED APPLICATIONS

This application claims priority to the co-pending provisional patent application, Application No. 60/764,392, entitled "High-Speed, Out-Of-Band Differential Pin Driver," with filing date Feb. 1, 2006, and assigned to the assignee of the present invention, which is hereby incorporated by reference in its entirety.

TECHNICAL FIELD

Embodiments of the present invention relate to differential input drivers. More specifically, embodiments of the present invention is related to high speed, out-of-band differential pin drivers used in automated test equipment.

BACKGROUND ART

Mixed signal integrated chips are driving increasingly higher performing applicants. Testing the chips that drive the computer systems require a wide range of escalating speeds, pin counts, analog bandwidth, resolution and timing requirements. Automated Test Equipment (ATE) ideally provides the accuracy and test coverage required for design verification while delivering high throughput and low cost for testing required in high volume manufacturing.

With the availability of more advanced chip design processes the sophistication of mixed-signal devices continues to evolve rapidly toward increased functionality and higher bandwidth. In conjunction, testing requirements are pushed toward higher speeds and greater precision in order to meet the new and evolving device test requirements.

In particular, differential signaling is used for high speed data transfer such as 3.2 Gbps or more. Differential signals can use lower voltage swings than single-ended signals. This is possible because the differential threshold in a differential receiver is better controlled than the threshold of a single transistor. The lower swing leads to faster circuits and can reduce power consumption. Differential signaling also reduces electromagnetic interference (EMI) since the opposite current carried on the two traces leads to cancellation of the electric and magnetic fields at larger distances. Similarly, differential signals are less sensitive to crosstalk.

Figure 1:
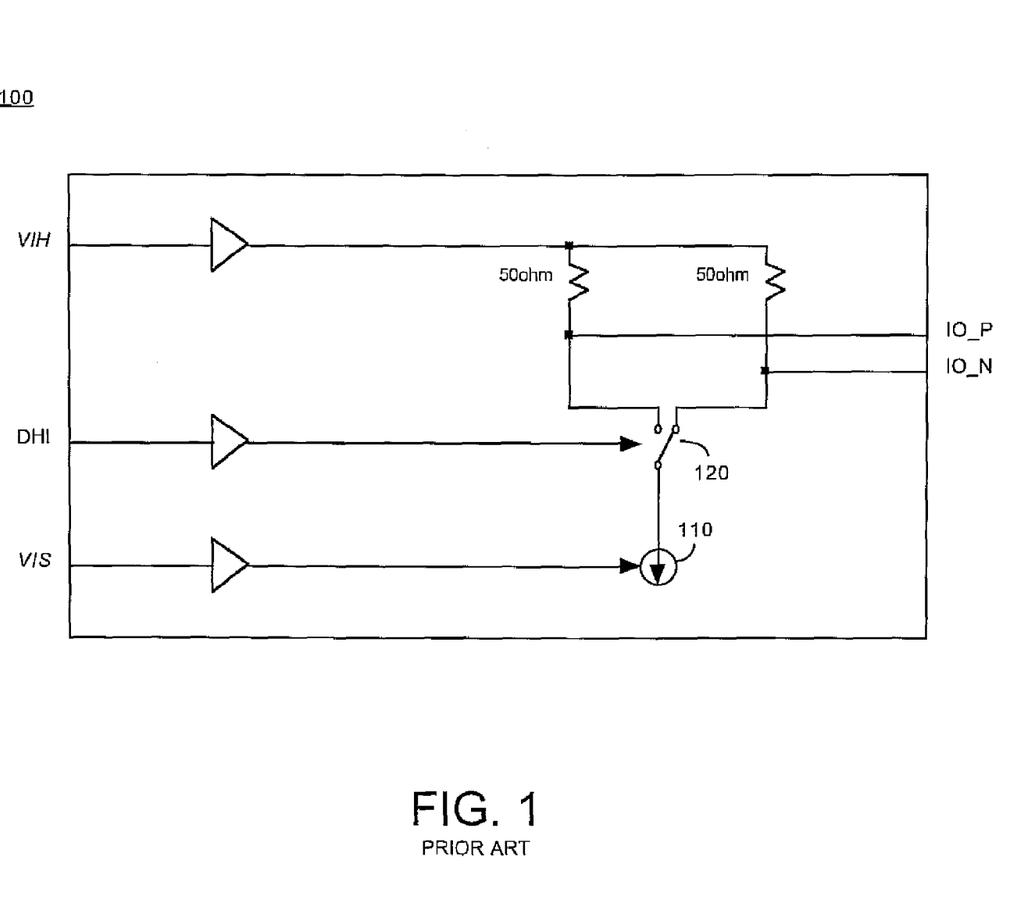
FIG. 1 is a circuit diagram of a conventional differential pin driver.

In order to drive a differential signal, an output stage of a conventional differential pin driver 100 employs a class-A configuration with a constant current source 110, a switch 120, and two 50 ohm source resistances, as shown in PRIOR ART FIG. 1. A high voltage level signal (VIH) determines the driver output high level, and a voltage swing signal (VIS) determines the driver output swing (i.e. the current source provides a current equal to VIS/50 ohms).

However, in the configuration of FIG. 1, the driver 100 can only provide two levels: drive-high level=VIH; or drive-low level=VIH-VIS. A high speed signal DHI controls the output logic to be either high or low for each output pin (IO_P or IO_N). The configuration of FIG. 1 is inadequate for testing mixed signal devices having multi-band instrumentation at higher speeds.

As such, what is needed is a differential pin driver capable of testing mixed signal devices with advanced analog instrumentation, including multi-band analog instrumentation.

SUMMARY OF THE INVENTION

A differential pin driver for supporting out-of-band signaling. The driver includes a class-A differential pin driver output stage that includes a positive output and a negative output. The driver also includes a positive level shifter for level shifting a voltage of the positive output, and a negative level shifter for level shifting a voltage of the negative output. The driver also includes a driver block that supports out-of-band signaling. The driver block includes a main enable switch that is controlled by a high speed driver inhibit (DINH) signal. The main enable switch controls coupling between a main current source and the differential pin driver output stage. The main enable switch is coupled in series with an output select switch that selects between the positive output and the negative output. The driver block also includes a positive enable switch for controlling coupling between the positive output and a positive level shifter that shifts voltages of the positive output. The positive enable switch is controlled by a positive enable signal. The driver block also includes a negative enable switch for controlling coupling between the negative output and a negative level shifter that shifts voltages of the negative output. The negative enable switch is controlled by a negative enable signal.

BRIEF DESCRIPTION OF THE DRAWINGS

The accompanying drawings, which are incorporated in and form a part of this specification, illustrate embodiments of the present invention and, together with the description, serve to explain the principles of the invention.

PRIOR ART

DETAILED DESCRIPTION OF THE INVENTION

Reference will now be made in detail to the embodiments of the present invention, a high-speed, out-of-band differential pin driver. While the invention will be described in conjunction with the embodiments, it will be understood that they are not intended to limit the invention to these embodiments.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, embodiments of the present invention provide an out-of-band i.e. multi-level (more than 2, and up to 4) signaling scheme on a differential pin driver, in accordance with one embodiment of the present invention. Other embodiments of the present invention provide the above accomplishments and also provide for driving out-of-band signaling to include generating a dynamic third level (e.g., termination) mode, shifting the common mode of differential signals, and providing four level of logic signals using 2 bits.

Figure 2:
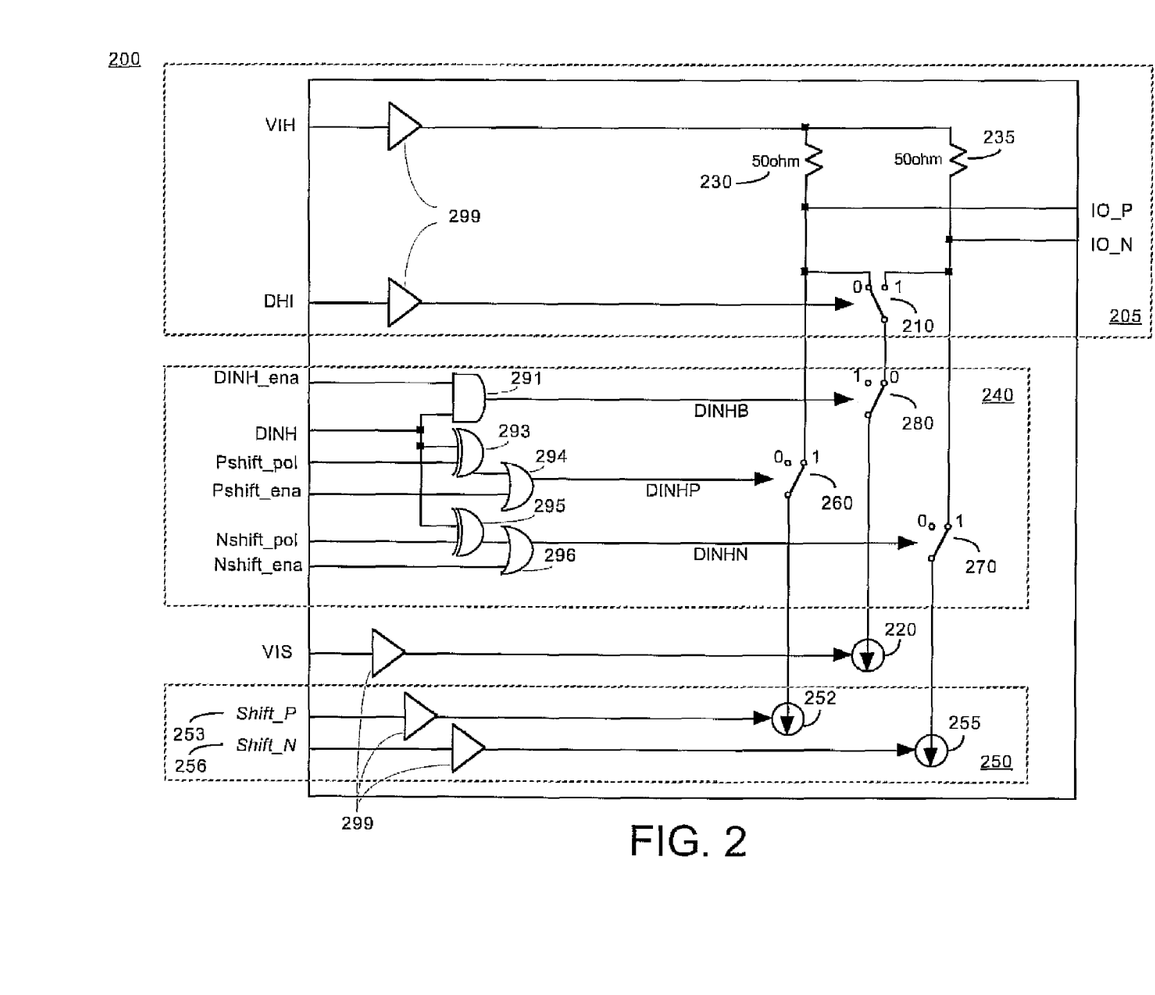
FIG. 2 is a circuit diagram of a high-speed differential pin driver capable of supporting out-of-band signaling, in accordance with an embodiment of the present invention.

FIG. 2 is an illustration of a circuit diagram of a high-speed differential pin driver 200 capable of supporting out-of-band signaling, in accordance with an embodiment of the present invention.

The signaling scheme of FIG. 2 is implemented using a high speed inhibit signal (DINH), in addition to a high speed output select (DHI) signal. By controlling two high speed signals (DHI and DINH) and implementing a plurality of control signals for mode select, out-of-band signaling can be realized, as will be discussed more fully below in relation to FIGS. 3-6.

The differential pin driver 200 of FIG. 2 includes a differential pin driver output stage 205. In one embodiment, the differential pin driver output stage is a class-A differential pin driver circuit. The differential pin driver output stage comprises a main current source 220 that is adjustable using a voltage, control input signal (VIS).

The differential pin driver output stage also comprises a positive output (IO_P) and a negative output (IO_N). The positive output and negative output is selectable by the DHI signal. More specifically, the DHI signal controls an output select switch 210 which is capable of coupling the main current source 220 either to IO_P or IO_N. That is, the output select switch 210 selectably controls coupling to IO_P or IO_N.

In addition, the differential pin driver output stage comprises a high reference voltage (VIH). The signal VIH is coupled to the positive output through a first resistor 230. Also, the signal VIH is coupled to the negative output through a second resistor 235. In one embodiment, the resistors 230 and 235 are identical. In another embodiment, the resistors 230 and 235 are 50 ohm resistors.

The differential pin driver 200 also comprises a level shifter block 250. The level shifter block 250 level adds skew to the P and N driver outputs, or in other words, shifts voltages of the positive output (IO_P) and the negative output (IO_N).

For example, the level shifter block 250 includes a positive level shifter for shifting a voltage of IO_P. The positive level shifter includes a controllable positive output current source 252 that is coupled to IO_P and a positive enable switch 260. As such, the positive enable switch 260 controls the coupling between IO_P and the positive level sifter that shifts the voltage of IO_P. In addition, the positive output current source 252 is adjustable through a voltage, control positive enable signal (Shift_P). That is, the positive output current source 252 determines the level shift for IO_P, and is able to shift the voltage on IO_P depending on the value of the Shift_P.

The level shifter block 250 also includes a negative level shifter for level shifting a voltage of IO_N. The negative level shifter includes a controllable negative output current source 255 that is coupled to IO_N and a negative enable switch 270. As such, the negative enable switch 270 controls the coupling between IO_N and the negative level sifter that shifts the voltage of IO_N. The negative output current source 255 is adjustable through voltage, control negative enable signal (Shift_N). That is, the negative output current source 255 determines the level shift for IO_N, and is able to shift the voltage on ION depending on the value of Shift_N.

The differential pin driver 200 also comprises a driver block 240. The driver block 240 provides out-of-band signaling. The driver block 240 is controlled by a high speed driver inhibit signal (DINH). The DINH signal controls a main enable switch 280 that controls coupling between the main current source 220 and the output stage 205. That is, the main enable switch 280 controls coupling between the main current source 220 and IO_P and IO_N.

In particular, the main enable switch 280 is coupled in series with the output select switch 210. More specifically, the main enable switch is coupled in series between the output select switch 210 and the main current source 220. As such, in embodiments of the present invention, the main current source 220 can be completely decoupled from the output stage 205. That is, the main current source 220 can be isolated, or decoupled, from IO_P and IO_N. As such, when the main enable switch 280 is open, no current would flow to IO_P or IO_N, and the voltage at IO_P and IO_N would rise to VIH, without any contribution from the level shifter block 250.

As shown in FIG. 2, the driver block is controlled by a plurality of logic gates. In particular, the logic gates controls the main enable switch 280, the positive enable switch 260, and the negative enable switch 270.

In one embodiment, the plurality of logic gates, as shown in FIG. 2, includes an AND logic gate 291, XOR gates 293 and 295, and OR gates 294 and 296.

In addition, five static control signals are provided for selecting out-of-band mode signaling. That is, the plurality of logic gates accepts a plurality of inputs including the DINH signal, and a plurality of input modes, the five static control signals, for generating the out-of-band mode signals. The static, input modes include the driver inhibit enable signal (DINH_ena), the Pshift_pol signal for shifting polarity of IO_P, and the Nshift_pol for shifting polarity of IO_N, the Pshift_ena for enabling the positive enable switch 260, and the Nshift_ena for enabling the negative enable switch 270.

As such, the combination of the high speed DINH signal, the high speed DHI signal, and the static control signals provides dynamic control to the three switches via the plurality of logic gates in the driver block 240. That is, control of the three switches are accomplished under on-the-fly, under test. The three switches 260, 270, and 280 are used to dynamically enable or disable the current sources controlled by VIS, Shift_P, and Shift_N. As a result, the differential pin driver circuit 200 of FIG. 2 is able to provide multi-level differential signals using IO_P and IO_N.

That is, the high-speed, out-of-band differential pin driver 200 can provide a multi-level differential signal depending on the state of the high speed DHI signal, and the logic output signals DINHB, DINHP, and DINHN leading to the switches 260, 270, and 280. The states of these signals are determined by the five static, input modes, DINH_ena, Pshift_pol, Pshift_ena, Nshift_pol, and Nshift_ena.

In one embodiment, the high-speed, out-of-band differential driver 200 provides a 4 level differential signal. Selectable levels on each of the channel outputs, IO_P and IO_N, are shown in Table 1, below:

TABLE 1

Four Level Differential Signal

| Channel | Level | Voltage Output |
|---------|-------|----------------|
| IO_P | Level-1 | VIH |
| IO_P | Level-2 | VIH − Shift P |
| IO_P | Level-3 | VIH − VIS |
| IO_P | Level-4 | VIH − (Shift P + VIS) |
| IO_N | Level-1 | VIH |
| IO_N | Level-2 | VIH − Shift N |
| IO_N | Level-3 | VIH − VIS |
| IO_N | Level-4 | VIH − (Shift N + VIS) |

As shown Table 1, the additional positive output and negative output current sources 252 and 255 determines the voltage level shift (Shift_P and Shfit_N) as applied in Table 1 for each of the IO_P and IO_N outputs independently. The switches 260, 270, and 280 are used to enable or disable the current sources 220, 252, and 255.

FIG. 2 also includes optional buffers 299. The buffers 299 indicate that the differential driver circuit 200 is sensitive only to voltage.

Figure 3A:
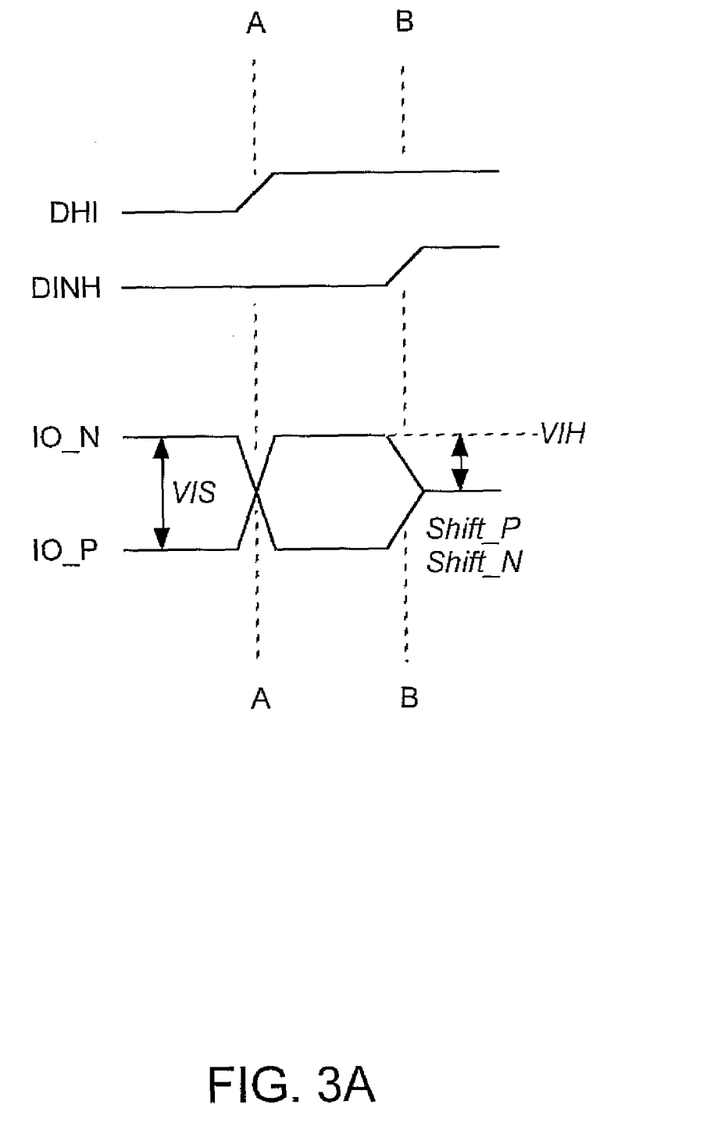
FIG. 3A are signal diagrams illustrating the signaling of a high-speed, out-of-band differential pin driver for generating a dynamic third level mode, or termination level mode, that is below a voltage level high (VIH) signal, in accordance with one embodiment of the present invention.

FIG. 3A are signal diagrams illustrating the signaling of a high-speed, out-of-band differential pin driver for generating a dynamic third level mode, or termination level mode, that is below a voltage level high (VIH) signal, in accordance with one embodiment of the present invention. The signal diagrams of FIG. 3A are waveforms generated by the differential pin circuit 200 of FIG. 2, in accordance with one embodiment of the present invention.

As previously described, the differential pin circuit 200 brings IO_P and IO_N to a termination mode that is high, at VIH. Specifically, by disabling Shift_P current source 252 and Shift_N current source 255, and by bringing DINH_ena and DINH both to 1, then the main enable switch 280 also is an open circuit. As such, both outputs IO_P and IO_N would go to termination level, VIH.

However, FIG. 3A provides for a midlevel termination mode by the differential pin driver circuit 200, in accordance with one embodiment of the present invention. In FIG. 3A, signal diagrams are shown for the DHI, DINH, IO_N, and IO_P signals. When DINH is low, the differential pin driver circuit 200 provides 2-level logic that is controlled by the DHI state with the swing of VIS provided by the main current source 220. That is, to the left of line B-B, while DINH is low, the outputs IO_P and IO_N have opposite polarity. The polarity of the outputs IO_P and IO_N is determined by the state of the DHI signal. As shown in FIG. 3A, at line A-A, the polarity of the outputs IO_P and IO_N shift with along with a shift in the polarity of DHI.

As DINH goes high, the main current source 220 is shut off by main current switch 280, and the outputs IO_P and IO_N are able to float to a midlevel termination state, regardless of the DHI state. The termination state is determined by the amount of level shifting from the positive output current source 252 and the negative output current source 255. Without any level shifting the termination state would go to VIH. However, the two current sources 252 and 255 are enabled in FIG. 3A and act to pull the output voltages down for IO_P and IO_N. As shown in FIG. 3A, the signals IO_P and IO_N each reach the same termination state that is below VIH, to the right of line B-B.

Table 2 below shows the state of the static, input modes necessary for generating a midlevel termination mode.

TABLE 2

Mid-Level Termination State Below VIH

| Signal | State |
|--------|-------|
| DINH_ena | High |
| Pshift_ena | Low |
| Pshift_pol | Low |
| Nshift_ena | Low |
| Nshift_pol | Low |

Figure 3B:
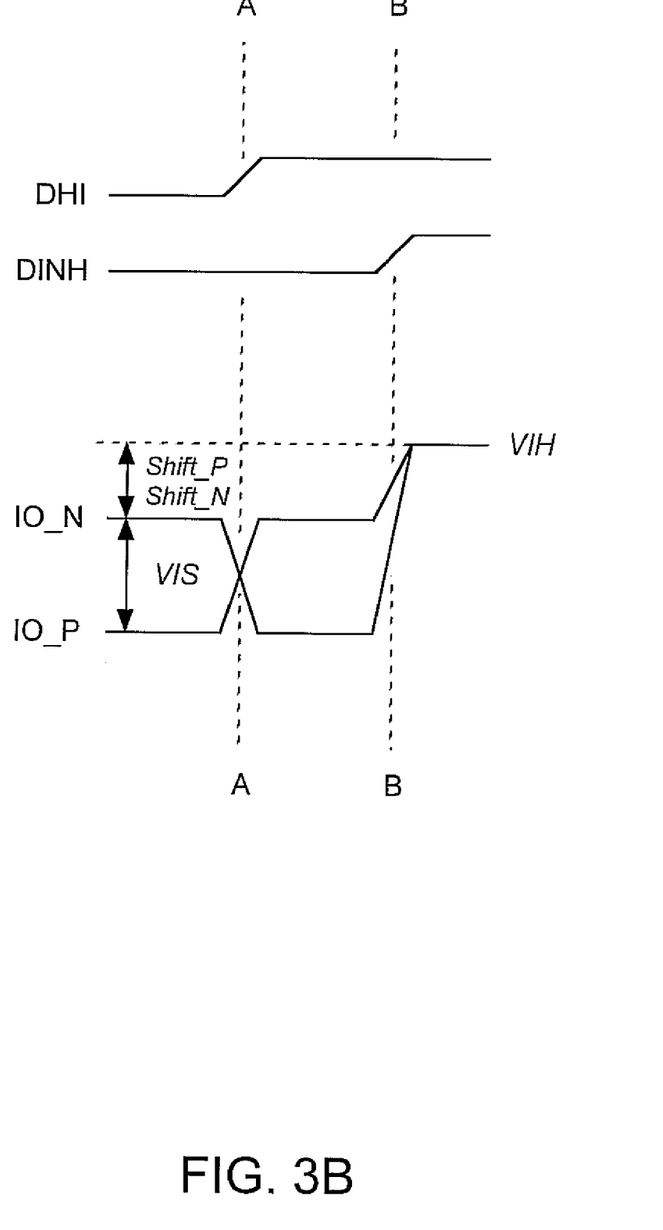
FIG. 3B are signal diagrams illustrating the signaling of a high-speed, out-of-band differential pin driver for generating a dynamic third level mode, or termination level mode, that is above a voltage level high (VIH) signal, in accordance with one embodiment of the present invention.

FIG. 3B are signal diagrams illustrating the signaling of a high-speed, out-of-band differential pin driver for generating a dynamic third level mode, or termination level mode, that is above a normalized, voltage level high (VIH) signal, in accordance with one embodiment of the present invention. In FIG. 3A, signal diagrams are shown for the DHI, DINH, IO_N, and IO_P signals. The signal diagrams of FIG. 3B are waveforms generated by the differential pin circuit 200 of FIG. 2, in accordance with one embodiment of the present invention.

As shown in FIG. 3B, when DINH is low, the differential pin driver circuit 200 provides 2-level logic that is controlled by the DHI state with the swing of VIS provided by the main current source 220. That is, to the left of line B-B, while DINH is low, the outputs IO_P and IO_N have opposite polarity. As shown in FIG. 3B, at line A-A, the polarity of the outputs IO_P and IO_N shift with along with a shift in the polarity of DHI.

However, as DINH goes high, the main current source 220 is again shut off, or is isolated from IO_P and IO_N, and the outputs IO_P and IO_N are set to the same termination level regardless of the state of DHI. As such, the common mode of the differential pin driver circuit 200 is shifted to a level above the normalized VIH.

In FIG. 3B, the positive output and negative output current sources 252 and 255 are disabled, or isolated from IO_P and IO_N. As such, all of the current sources are isolated or shut off from IO_P and IO_N. By programming an artificially high VIH that is above the normalized VIH, the differential pin driver circuit 200 can reach a termination level that is higher than the normalized VIH, as is shown in FIG. 3B to right of line B-B.

Table 3 below shows the state of the static, input modes necessary for generating a termination mode that is higher than the normalized VIH.

TABLE 3

Mid-Level Termination State Above Normalized VIH

| Signal | State |
| --- | --- |
| DINH_ena | High |
| Pshift_ena | Low |
| Pshift_pol | High |
| Nshift_ena | Low |
| Nshift_pol | High |

Figure 4A:
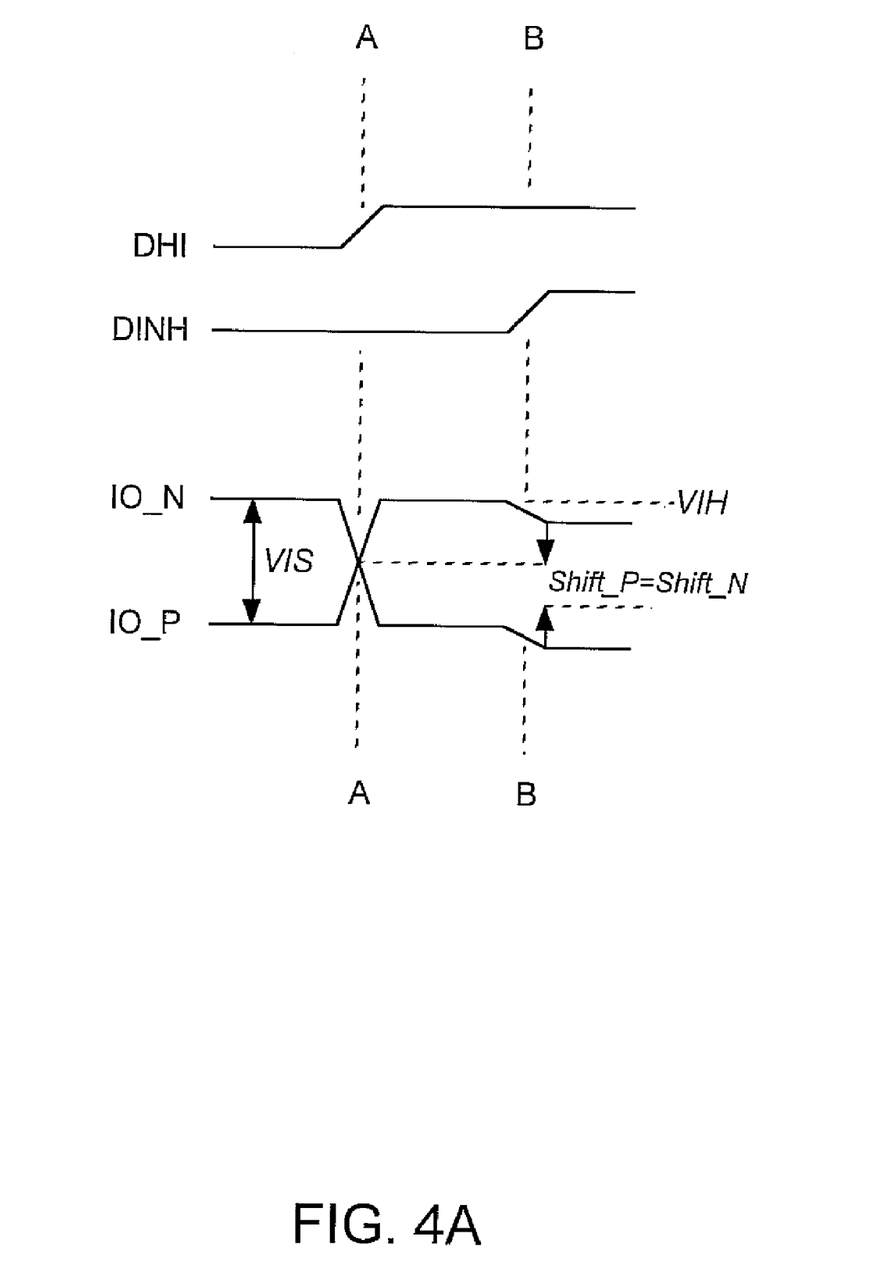
FIG. 4A are signal diagrams illustrating the signaling of a high-speed, out-of-band differential pin driver for generating a negative shift of the common mode voltage, in accordance with one embodiment of the present invention.

FIG. 4A are signal diagrams illustrating the signaling of a high-speed, out-of-band differential pin driver for generating a negative shift of the common mode voltage, in accordance with one embodiment of the present invention. That is, FIG. 4A is a diagram illustrating the signaling of a high-speed, out-of-band differential pin driver for providing shifting of the common mode voltage. In FIG. 4A, signal diagrams are shown for the DHI, DINH, IO_N, and IO_P signals. The signal diagrams of FIG. 4A are waveforms generated by the differential pin circuit 200 of FIG. 2, in accordance with one embodiment of the present invention.

As shown in FIG. 4A, when the DINH signal is low, the driver provides 2-level logic controlled by the state of the DHI signal, with the swing of VIS. That is, to the left of line B-B, while DINH is low, the outputs IO_P and IO_N have opposite polarity. As shown in FIG. 4A, at line A-A, the polarity of the outputs IO_P and IO_N shift with along with a shift in the polarity of DHI.

However, as DINH signal goes high, as indicated to the right of line B-B of FIG. 4A, the main current source 220 is still enabled. As such, the differential pin driver circuit 200 is able to switch between 0 and 1 on the outputs IO_P and IO_N. That is, the differential signal is always maintained.

In addition, to the right of line B-B, the common mode voltage between IO_P and IO_N is equally shifted by the level voltages, Shift_P and Shift_N. That is, the two current sources 252 and 255 are enabled and act to pull down the output voltages down for IO_P and IO_N so that the nominal common mode voltage to the left of line B-B is shifted dynamically, on-the-fly, during test to a margin low.

Table 4 below shows the state of the static, input modes necessary for generating the margin low shift in the common mode voltage.

TABLE 4

Margin Low Shift in Common Mode Voltage

| Signal | State |
| --- | --- |
| DINH_ena | Low |
| Pshift_ena | Low |
| Pshift_pol | Low |
| Nshift_ena | Low |
| Nshift_pol | Low |

Figure 4B:
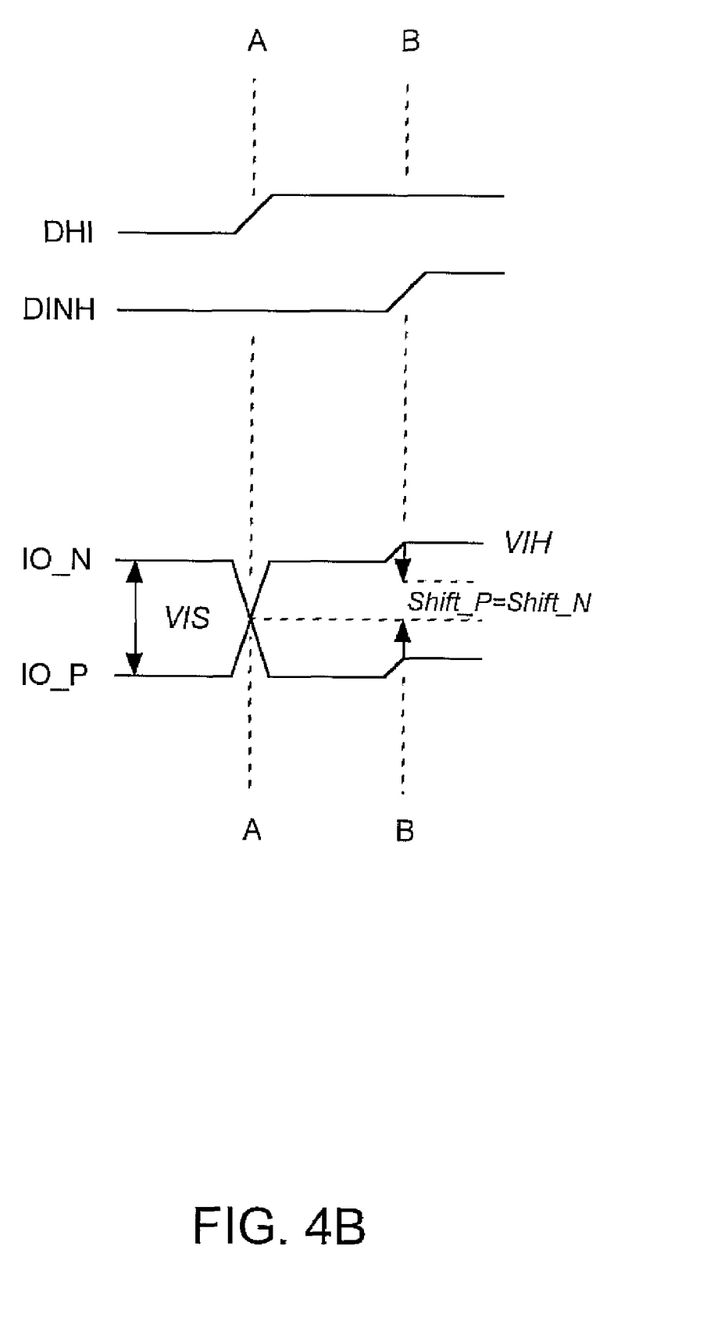
FIG. 4B are signal diagrams illustrating the signaling of a high-speed, out-of-band differential pin driver for providing a positive shift of the common mode voltage, in accordance with one embodiment of the present invention.

FIG. 4B are signal diagrams illustrating the signaling of a high-speed, out-of-band differential pin driver for generating a positive shift of the common mode voltage, in accordance with one embodiment of the present invention. That is, FIG. 4B illustrates the signaling of a high-speed, out-of-band differential pin driver for providing a positive shift of the common mode voltage. In FIG. 4B, signal diagrams are shown for the DHI, DINH, IO_N, and IO_P signals. The signal diagrams of FIG. 4B are waveforms generated by the differential pin circuit 200 of FIG. 2, in accordance with one embodiment of the present invention.

As shown in FIG. 4B, when the DINH signal is low, the driver provides 2-level logic controlled by the state of the DHI signal, with the swing of VIS. That is, to the left of line B-B, while DINH is low, the outputs IO_P and IO_N have opposite polarity. As shown in FIG. 4B, at line A-A, the polarity of the outputs IO_P and IO_N shift with along with a shift in the polarity of DHI.

However, as DINH signal goes high, as indicated to the right of line B-B of FIG. 4B, the main current source 220 is still enabled. As such, the differential pin driver circuit 200 is able to switch between 0 and 1 on the outputs IO_P and IO_N. That is, the differential signal is always maintained.

In addition, to the right of line B-B, the common mode voltage between IO_P and IO_N is equally shifted by the level voltages, Shift_P and Shift_N. That is, the two current sources 252 and 255 are disabled and act to drive up the output voltages down for IO_P and IO_N so that the nominal common mode voltage to the left of line B-B is shifted dynamically, on-the-fly, during test to a margin high.

Table 5 below shows the state of the static, input modes necessary for generating the margin high shift in the common mode voltage.

TABLE 5

Margin High Shift in Common Mode Voltage

| Signal | State |
| --- | --- |
| DINH_ena | Low |
| Pshift_ena | Low |
| Pshift_pol | High |
| Nshift_ena | Low |
| Nshift_pol | High |

Figure 5:
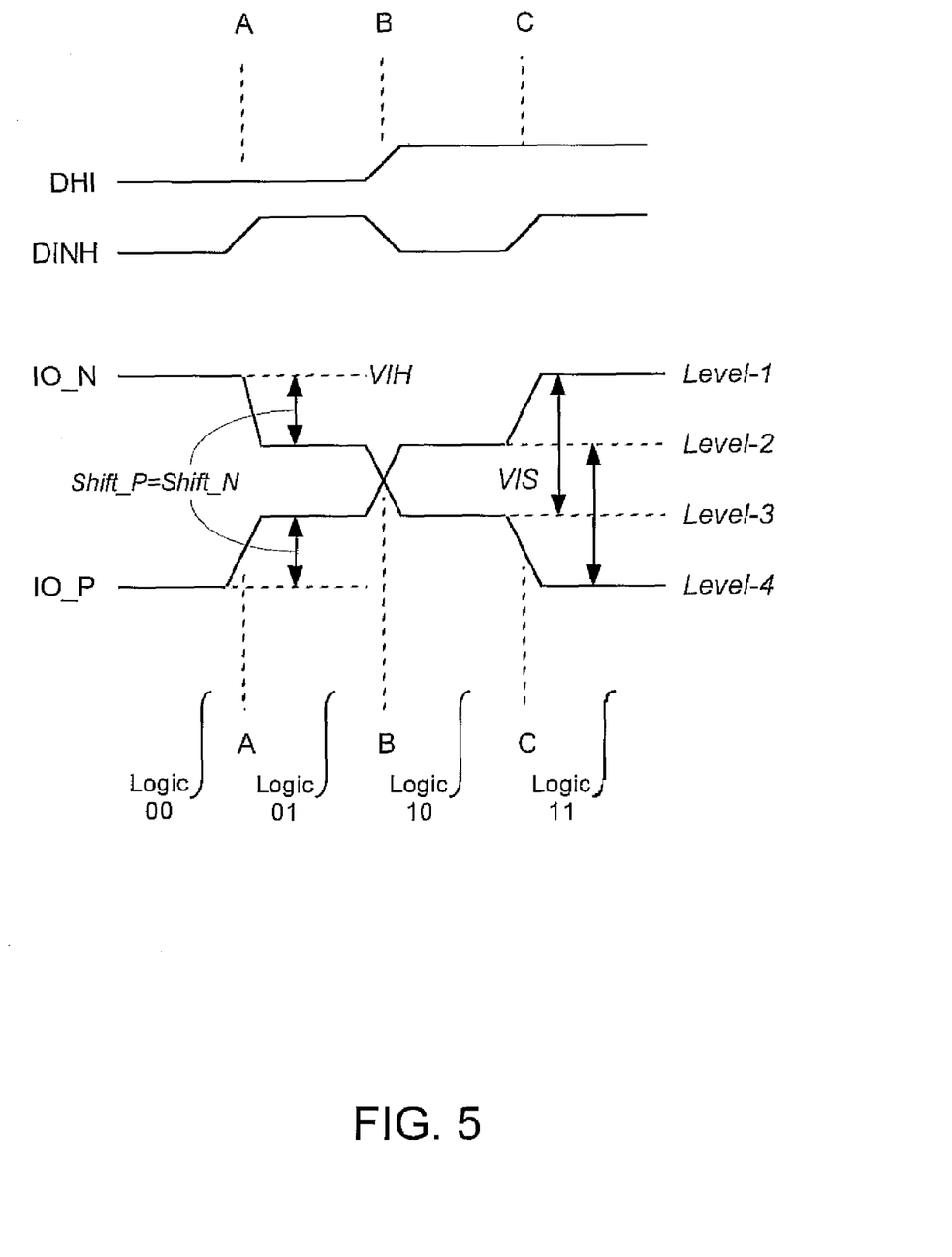
FIG. 5 is a diagram illustrating a high speed, out-of-band differential pin driver for generating multi-level signaling, in accordance with one embodiment of the present invention.

Now turning to FIG. 5, signal diagrams are shown illustrating the signaling of a high-speed, out-of-band differential pin driver for providing multi-level signaling, in accordance with one embodiment of the present invention. In FIG. 5, the signal diagrams are shown for the DHI, DINH, IO_P, and IO_N signal. FIG. 5 illustrates a 4-level, 2 bit, logic, in embodiments of the present invention. The signal diagrams of FIG. 5 are waveforms generated by the differential pin driver circuit 200 of FIG. 2, in accordance with one embodiment of the present invention.

Table 6 below shows the state of the static, input modes necessary for generating multi-level signaling.

TABLE 6

Multi-Level Signaling

| Signal | State |
| --- | --- |
| DINH_ena | Low |
| Pshift_ena | Low |
| Pshift_pol | High |
| Nshift_ena | Low |
| Nshift_pol | Low |

As shown in Table 6, by setting the level shift polarity (Pshift_pol and Nshift_pol) to be opposite, and setting DINH_ena to be low (i.e. DHI is always activated), DHI and DINH can act as two bit logic control signals to realize 4-level logic states at the output. In one implementation, VIH, the main current source 220, the positive output current source 252, and the negative output current source 255 are configured to achieve the four output levels (Level-1, Level-2, Level-3, and Level-4).

As such, when DINH=Low and DHI=Low, the output logic is 00 (IO_P=Level-4, IO_N=Level-1), as shown to the left of line A-A of FIG. 5. When DINH=High and DHI=Low, the output logic is 01 (IO_P=Level-3, IO_N=Level-2), as shown between the lines A-A and B-B of FIG. 5. Also, when DINH=Low and DHI=High, the output logic is 10 (IO_P=Level-2, IO_N=Level-3), as shown between the lines B-B and C-C of FIG. 5. In addition, when DINH=High and DHI=High, the output logic is 11 (IO_P=Level-1, IO_N=Level-4).

Figure 6:
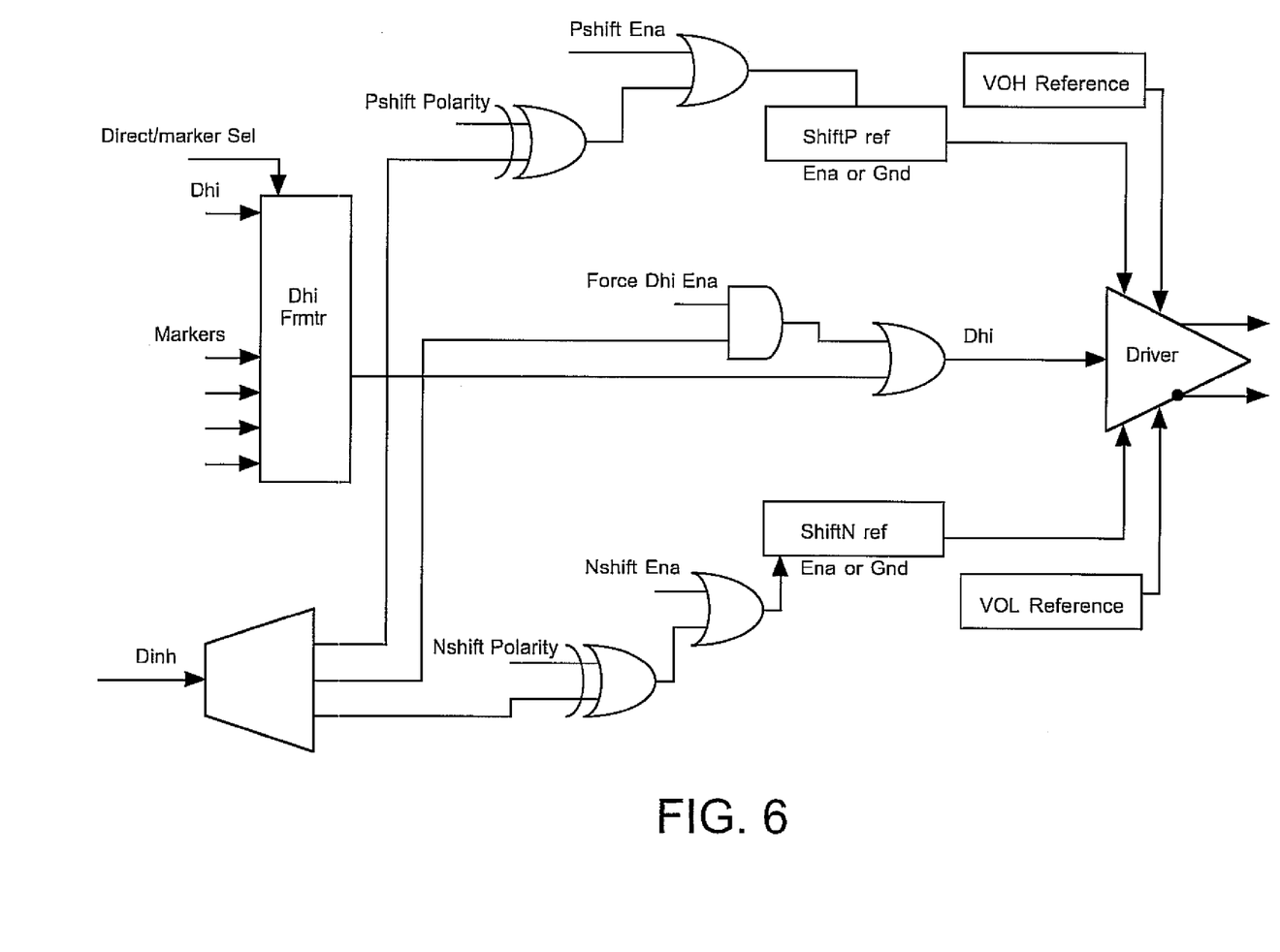
FIG. 6 is a circuit diagram of an alternative embodiment of a high-speed differential pin driver capable of supporting out-of-band signaling, in accordance with an embodiment of the present invention.

FIG. 6 is a circuit diagram of an alternative embodiment of a high-speed differential pin driver capable of supporting out-of-band signaling, as previously described in relation to FIGS. 2, 3A, 3B, 4A, 4B, and 5, in accordance with an embodiment of the present invention.

Accordingly, embodiments of the present invention provide an out-of-band i.e. multi-level (more than 2, and up to 4) signaling scheme on a differential pin driver, in accordance with one embodiment of the present invention. Other embodiments of the present invention provide the above accomplishments and also provide for driving out-of-band signaling to include generating a dynamic third level (e.g., termination) mode, shifting the common mode of differential signals, and providing four level of logic signals using 2 bits.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the claims appended hereto and their equivalents.

What is claimed is:

1. A differential pin driver, comprising:
   a class-A differential pin driver output stage comprising a positive output and a negative output selectable by a high speed signal output select (DHI) signal controlling an output select switch;
   a driver block for providing out-of-band signaling that is controlled by a high speed driver inhibit signal (DINH) that controls a main enable switch controlling coupling between a main current source and said positive and negative outputs, wherein said main enable switch is coupled in series with said output select switch; and
   a level shifter block for level shifting voltages of said positive output and said negative output.

2. The differential pin driver of claim 1, wherein said class-A differential pin driver output stage further comprises:
   wherein said output select switch selectably controls coupling to said positive output and said negative output; and
   a high reference voltage coupled to said positive output through a first resistor, and coupled to said negative output through a second resistor.

3. The differential pin driver of claim 2, wherein said first resistor and second resistor are identical.

4. The differential pin driver of claim 1, further comprising a voltage input for adjusting current output from said main current source.

5. The differential pin driver of claim 1, wherein said driver block comprises:
   said main enable switch coupled in series between said output switch and said main current source;
   a positive enable switch coupled to said positive output and said level shifter block, wherein said positive enable switch is controlled by a positive enable signal; and
   a negative enable switch coupled to said negative output and said level shifter block, wherein said negative enable switch is controlled by a negative enable signal.

6. The differential pin driver of claim 1, wherein said level shifter block comprises:
   a controllable positive output current source coupled to said positive output and said positive enable switch; and
   a controllable negative output current source coupled to said negative output and said negative enable switch.

7. The differential pin driver of claim 1, wherein said driver block further comprises:
   a plurality of logic gates for controlling said main enable switch, said positive enable switch, and said negative enable switch, wherein said plurality of logic gates accepts a plurality of inputs including said DINH signal, and a plurality of input modes.

8. The differential pin driver of claim 1, wherein said positive output and negative output provides a multi-level differential signal of up to four levels.

9. A differential pin driver, comprising:
   a class-A differential pin driver output stage comprising a positive output and a negative output selectable by a high speed output select signal controlling an output select switch;
   a positive level shifter for level shifting a voltage of said positive output;
   a negative level shifter for level shifting a voltage of said negative output; and
   a driver block for providing out of band signaling controlled by a high speed driver inhibit (DINH) signal.

10. The differential pin driver of claim 9, wherein said driver block comprises:
    a main enable switch controlled by a main enable signal, wherein said main enable switch is coupled in series with said output select switch for controlling coupling between a main current source and said class-A differential pin driver output stage;
    a positive enable switch for controlling coupling between said positive output and said positive level shifter, wherein said positive enable switch is controlled by a positive enable signal; and
    a negative enable switch for controlling coupling between said negative output and said negative level shifter, wherein said negative enable switch is controlled by a negative enable signal.

11. The differential pin driver of claim 9, wherein said driver block further comprises:
    a plurality of logic gates for controlling said main enable switch, said positive enable switch, and said negative enable switch, wherein said plurality of logic gates accepts a plurality of inputs including said DINH signal and a plurality of input modes.

12. The differential pin driver of claim 9, wherein said positive level shifter comprises:
    a controllable positive output current source coupled to said positive output.

13. The differential pin driver of claim 9, wherein said negative level shifter comprises:

a controllable negative output current source coupled to said negative output.

14. A driver block for a differential pin driver, comprising:

a main enable switch controlled by a high speed driver inhibit (DINH) signal for controlling coupling between a main current source and a differential pin driver output stage, wherein said main enable switch is coupled in series to an output select switch for selecting between a positive output and a negative output;

a positive enable switch for controlling coupling between said positive output and a positive level shifter that shifts voltages of said positive output, wherein said positive enable switch is controlled by a positive enable signal; and a negative enable switch for controlling coupling between said negative output and a negative level shifter that shifts voltages of said negative output, wherein said negative enable switch is controlled by a negative enable signal.

15. The driver block of claim 14, wherein said driver block drives a class-A differential pin driver comprising:

said differential pin driver output stage comprising said positive output and said negative output;

said main current source, wherein said output select switch is coupled to said main current source, said positive output, and said negative output; and a high reference voltage coupled to said positive output through a first resistor, and coupled to said negative output through a second resistor.

16. The driver block of claim 15, wherein said first and second resistors are identical.

17. The driver block of claim 14, further comprising:

a plurality of logic gates for controlling said main enable switch, said positive enable switch, and said negative enable switch, wherein said plurality of logic gates accepts a plurality of inputs including said DINH signal and a plurality of input modes.

18. The driver block of claim 14, wherein said output select switch is controlled by a high speed output select signal (DHI).

19. The driver block of claim 14, wherein said positive output and negative output provides a multi-level differential signal.

20. The driver block of claim 14, wherein said positive level shifter comprises a controllable positive output current source coupled to said positive output; and wherein said negative level shifter comprises a controllable negative output current source coupled to said negative output.

* * * * *